(12) United States Patent
Sartorius

(10) Patent No.: US 8,463,087 B2
(45) Date of Patent: Jun. 11, 2013

(54) BEAT SIGNAL GENERATING DEVICE FOR USE IN A TERAHERTZ SYSTEM, TERAHERTZ SYSTEM AND USE OF A BEAT SIGNAL GENERATING DEVICE

(75) Inventor: Bernd Sartorius, Berlin (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 198 days.

(21) Appl. No.: 13/081,135

(22) Filed: Apr. 6, 2011

(65) Prior Publication Data

US 2012/0257645 A1 Oct. 11, 2012

(51) Int. Cl.
*G02B 6/12* (2006.01)

(52) U.S. Cl.
USPC .......................................................... 385/14

(58) Field of Classification Search
None
See application file for complete search history.

(56) References Cited

U.S. PATENT DOCUMENTS

| | | | |
|---|---|---|---|
| 5,878,066 A * | 3/1999 | Mizutani et al. | 372/27 |
| 6,122,306 A | 9/2000 | Sartorius | |
| 2002/0181518 A1* | 12/2002 | Mizutani | 372/27 |
| 2003/0086174 A1* | 5/2003 | Wakisaka et al. | 359/566 |
| 2005/0129361 A1 | 6/2005 | Kim et al. | |
| 2010/0080505 A1 | 4/2010 | Sartorius et al. | |
| 2010/0142571 A1 | 6/2010 | Park et al. | |

FOREIGN PATENT DOCUMENTS

| | | |
|---|---|---|
| DE | 10 2006 058 395 | 6/2008 |
| EP | 0 818 069 B1 | 1/1998 |
| WO | 2007/085573 A1 | 8/2007 |
| WO | 2008/067957 A2 | 6/2008 |

OTHER PUBLICATIONS

Li et al., "Multiwavelength Gain-Coupled DFB Laser Cascade: Design Moedeling and Simulation", IEEE Journal of Quantum Electronics, vol. 36, No. 10, Oct. 2000.

Lima et al., "Compact optical millimetre-wave source using a dual-mode semiconductor laser", Electronics Letters, vol. 31, No. 5, Mar. 1995.

Xinhong et al., "Optical Generation of Microwave/Millimeter-Wave Signals Using Two-Section Gain-Coupled DFB Lasers", IEEE Photonics Technology Letters, vol. 11, No. 10, Oct. 1999.

European Search Report dated Sep. 9, 2011 as received in related application No. 11161313.9-1226.

Möhrle, Martin et al., "Detuned Grating Multisection-RW-DFB Lasers for High-Speed Optical Signal Processing," IEEE Journal on Selected Topics in Quantum Electronics, Mar./Apr. 2001, vol. 7, No. 2, pp. 217-223.

(Continued)

*Primary Examiner* — Sung Pak
(74) *Attorney, Agent, or Firm* — Maschoff Brennan

(57) ABSTRACT

A beat signal generating device including first and second monomode lasers for generating radiation of a first and second wavelengths respectively; a first and a second output port; a phase modulating unit for modifying both the phase of radiation generated by both the first laser and second laser, wherein radiation generated by the first laser is transmitted through the second laser and superposed with the radiation generated by the second laser at the second output port, and the radiation generated by the second laser is transmitted through the first laser and superposed with the radiation generated by the first laser at the first output port, such that a first beat signal will be emitted at the first output port and a second beat signal will be emitted at the second output port, wherein the phase between the beat signals can be adjusted by means of the phase modulating unit.

16 Claims, 4 Drawing Sheets

OTHER PUBLICATIONS

Kim, N. J. et al., "Widely tunable detuned dual-mode multisection laser diode for continuous-wave THz generation," Infrared Millimeter and Terahertz Waves (IRMMW-THz), 2010 35th International Conference on, Sep. 5-10, 2010, pp. 1-2.

Kim, Namje et al., "Monolithic dual-mode distributed feedback semiconductor laser for tunable continuous-wave terahertz generation," Optics Express, (2009), vol. 17, Issue 16, pp. 13851-13859.

* cited by examiner

BEAT SIGNAL GENERATING DEVICE FOR USE IN A TERAHERTZ SYSTEM, TERAHERTZ SYSTEM AND USE OF A BEAT SIGNAL GENERATING DEVICE

BACKGROUND

It is known in the art to use optical beat signals for controlling Terahertz systems, i.e. for controlling a Terahertz transmitter and/or a Terahertz receiver. Terahertz electromagnetic radiation in the range between 0.1 THz and 10 THz can be employed in a variety of fields such as safety engineering or spectroscopy. A Terahertz system is disclosed, for example, in US 2010/0080505 A1.

SUMMARY

It is an object of the invention to provide a beat signal generating device for a Terahertz system and a Terahertz system that can be produced as cost-effective as possible.

According to the invention, a beat signal generating device for use in a Terahertz system is provided, the device comprising a first monomode laser for generating radiation of a first wavelength;
a second monomode laser for generating radiation of a second wavelength different from the first wavelength;
a first and a second output port;
a phase modulating unit for modifying both the phase of radiation generated by the first laser and the phase of radiation generated the second laser, wherein the beat signal generating device is configured in such a way that
the radiation generated by the first laser is transmitted through the second laser and superposed with the radiation generated by the second laser at the second output port, and
the radiation generated by the second laser is transmitted through the first laser and superposed with the radiation generated by the first laser at the first output port, such that
a first beat signal will be emitted at the first output port and a second beat signal will be emitted at the second output port, wherein the phase between the first and the second beat signal can be adjusted by means of the phase modulating unit.

The first laser thus is configured to be sufficiently transparent for the second wavelength and the second laser is configured to be sufficiently transparent for the first wavelength. For example, the transparency of the first and the second laser for the wavelength generated by the respective other laser is at least 70%, at least 80% or at least 90%. Examples of suitable lasers will be discussed further below.

The two monomode lasers and the phase modulating unit may be formed by a semiconductor chip; for example the lasers and the phase modulating unit are integrally formed by a semiconductor chip. The chip integration may have the advantage that phase instabilities in light paths from the first and the second laser towards the first and the second output port affecting only one of the generated wavelengths are reduced or avoided. The two output ports may be formed by side facets of the chip (comprising a semiconductor substrate and material layers arranged on the substrate), wherein an anti-reflection coating may be arranged on at least one of the output ports (on the chip facets).

According to another embodiment of the invention, the beat signal generating device comprises a plurality of optical waveguides connecting the first laser to the first output port and to the phase modulating unit, respectively, and connecting the second laser to the second output port and to the phase modulating unit, respectively.

In other word, the phase modulating unit is arranged between the first and the second laser. For example, the waveguides are straight waveguides and are e.g. arranged along a common axis such that the waveguides form a straight waveguide whose axis runs through the two lasers and the phase modulating unit. Thus, the components (the lasers and the phase modulating unit) of the beat generating device are arranged in row without the use of bends and couplers such that the dimensions of the device are reduced compared to the known optical beat signal sources. For example, the beat generating device according to the invention occupies an area of at most approximately 1 mm×0.3 mm.

The waveguides may also be integrated on a semiconductor chip (e.g. in the form of ridge or embedded waveguides). Also, the waveguides, the lasers and/or the phase modulating unit could be integrally formed. It is noted that the first and the second laser do not necessarily have to be connected to the phase modulating unit via straight waveguides. Other waveguides, in principle, could also be used, wherein, however, the (single) phase modulating unit is arranged and configured in such a way that it affects the first wavelength radiation differently than the second wavelength generation such that the phase between the first and the second beat signal can be adjusted.

Further more, it is possible that the first and/or the second laser adjoins the first and second output port (arranged, for example, in a facet of the chip) directly such that a separate waveguide between the first laser and the first output port or between the second laser and the second output port is not required. Similarly, the first and the second laser may adjoin the phase modulating unit directly such that a separate waveguide between the first laser and the phase modulating unit or between the second laser and the phase modulating unit is not necessary. However, the first laser, the second laser and/or the phase modulating unit may comprise a waveguide or may form a waveguide for guiding light through these components and for coupling light into the adjoining component(s).

According to yet another embodiment of the invention, the phase modulating unit is an electro-optical unit, wherein the unit comprises a waveguide through which light of the first and the second laser is guided and at least one electrode for applying a voltage across the waveguide and/or injecting a current into the waveguide. For example, the electro-optical unit is arranged between the first and the second laser. Applying a voltage to the electrode changes the refractive index in the waveguide of the phase modulating unit thereby modifying the phase of the light passing through the waveguide (i.e. the light generated by the first and the second laser). For example, the waveguide of the phase modulating unit is integrally formed with waveguides connecting the first and the second laser to the phase modulating unit. For example, the phase modulating unit comprises an electrical input port via which an electrical voltage with a frequency in the kHz to GHz range can be supplied to the electrode.

According to another refinement of the invention the first laser is a (first) DFB laser and the second laser is a (second) DFB laser, wherein the first DFB laser is configured to generate radiation on the long wavelength side of its stop band and the second DFB laser is configured to generate radiation on the short wavelength side of its stop band.

A DFB laser (distributed feedback laser) comprises a laser active medium and a Bragg grating arranged along the laser active medium wherein in the region of the Bragg wavelength of the grating the DFB laser comprises a stop band, i.e. a wavelength region of high reflectivity of the Bragg grating. For example, the stop band has a spectral width of several nanometers, e.g. 4 nm, if the Bragg grating possesses an average coupling coefficient. Further, a DFB laser (having a homogeneous Bragg grating) preferably emits in a first mode having a wavelength adjacent to the stop band on the short wavelength side of the stop band ("short wavelength mode") and in a second mode having a wavelength adjacent to the stop band on the long wavelength side of the stop band ("long wavelength mode"). The properties of DFB lasers, however, are well known in the art such that they will not be discussed in more detail.

In particular, the Bragg gratings of the first and the second DFB laser are configured in such a way that the radiation wavelength of the first DFB laser (i.e. the "first wavelength") lies outside the stop band region of the second DFB laser and the radiation wavelength of the second DFB laser (i.e. the "second wavelength") lies outside the stop band of the first DFB laser. For example, the Bragg gratings of the first and the second DFB laser are configured in such a way that the radiation generated by the first DFB laser has a shorter wavelength than the radiation generated by the second DFB laser; i.e. the Bragg wavelength of the grating of the first DFB laser is smaller than the Bragg wavelength of the grating of the second DFB laser.

It is noted that it is also possible that both the first and the second DFB laser are configured to generate radiation either on the short wavelength side or on the long wavelength side of the respective stop band. In that case the Bragg gratings of the lasers have to be configured in such a way that the emission wavelengths of the lasers differ from one another by at least the stop band width of one of the lasers in order to prevent that the emission of one of the lasers is blocked by the Bragg grating of the other laser. It is also conceivable that the first and/or the second DFB laser is of the $\lambda/4$ type whose emission wavelength lies in the middle of the stop band.

However, if smaller beat frequencies (for example below 500 GHz) shall be generated the first DFB laser will be set to emit on the long wavelength side of the stop band and the second DFB laser will be configured to emit on the short wavelength side of the stop band (or vice versa) as mentioned above. This configuration, in principle, allows to produce any beat frequency (e.g. also below 100 GHz) depending on the wavelength difference between the first and the second wavelength (and without the problem that the first or the second wavelength emission is blocked by the second or the first laser, respectively).

Several measures for realizing a monomode output of a DFB laser either of the short wavelength mode or the long wavelength mode exist. For example, DFB lasers with conventionally index coupled Bragg gratings will emit on the short wavelength side of the stop band due to the effect of longitudinal hole burning. Exciting the long wavelength mode of a DFB laser could be achieved by using a gain coupled (complex coupled) Bragg grating instead of an index coupled grating. A gain coupled grating can be fabricated, for example, by providing grooves that extend into the active layer of the section. Thus, the first DFB laser may have a gain coupled Bragg grating and the second DFB laser may have an index coupled Bragg grating in order to provide a first DFB laser emitting on the long wavelength side of the stop band and a second DFB laser emitting on the short wavelength side of the stop band.

Further more, the first DFB laser may comprise at least a first and a second section, each section having a first and a second Bragg grating, i.e. the laser is formed as a multisection DFB laser. The Bragg wavelengths and the widths of the stop bands (i.e. the coupling coefficients) of the first and the second Bragg grating differ in such a way that only the wavelengths of the long wavelength modes in the first and the second section compare, i.e. only the long wavelength modes of first and the second section overlap. Similarly, the second DFB laser can also be realized as a multisection DFB laser, wherein the Bragg grating are configured in such a way that only the short wavelength modes overlap.

A multisection (e.g. a two-section) DFB laser as the first and/or the second DFB laser may replace a DFB laser with a gain coupled Bragg grating, wherein the Bragg gratings of both sections may be formed as index coupled gratings such that no gain coupled grating has to be provided (such that the more difficult generation of a gain coupled grating is avoided). If both the first and the second DFB laser are realized as multisection DFB lasers, the Bragg grating of the sections are e.g. configured in such a way that the emission wavelength of one of the lasers in not blocked by the stop band of the other laser.

It is furthermore possible that the first and/or the second laser comprise means for tuning the wavelength of the radiation generated by these lasers. For example, the means for tuning comprise a heating assigned to the respective laser, for example a resistive heating.

In an example, the means for tuning permit to alter the Bragg wavelength of at least one of the first and the second Bragg grating of the first two-section DFB laser such that, for example an overlap of the long wavelength modes can be switched to an overlap of the short wavelength modes. Similarly, the Bragg wavelength of at least one of the first and the second section of the second laser can be altered such that the overlap of the short wavelength modes can be switched to an overlap of the long wavelength modes. This allows to switch the difference between the first and the second output wavelength of the beat generating device and thus to switch the beat frequency to different tuning range.

In particular, the means for tuning the wavelength can be configured in such a way that a first heating element is assigned to the first section of the first two-section DFB laser and a second heating element is assigned to the second section of the first laser such that the Bragg wavelength of the first and the second Bragg grating of the first laser can be altered independently from one another. Similarly, a first and a second heating element can be assigned to the first and the second section of the second two-section DFB laser. Using the heating elements, a predetermined mode switching can be carried out.

Also, the laser current injected into the active regions of the sections of the two-section DFB lasers could be controlled in such a way that the current can be set individually for each segment. For example, each section of the first and/or the second laser has an individual electrode, wherein the electrodes are controlled independently. By injecting different currents into the different sections of the laser the spectral position of the laser modes can be shifted, which can also be used for producing a switch between the short and the long wavelength mode and vice versa.

It is noted that the invention is, of course, not restricted to the use of DFB lasers as the first and/or the second laser. Rather, other kinds of lasers could be used such as DBR lasers that may have a Bragg reflector on both sides of the active medium. Also, it is not necessary to use semiconductor lasers. It is also possible that, for example, other solid state lasers or gas lasers are used, wherein the light between the first and the second laser and/or between the lasers and the phase modulating unit is at least partially not guided within a waveguide, but, for example, is a free laser beam.

The beat signal generating device could furthermore comprise a mode transforming device ("taper") that transforms the spatial intensity distribution of radiation generated by the first and/or a second laser into a modified spatial intensity distribution. This embodiment, in particular, refers to the embodiment comprising a first and a second laser integrated in a semiconductor chip. The mode transforming device reduces coupling losses upon coupling of light from a chip facet into, for example, an optical fibre. The mode transforming device transforms the spatial intensity distribution of light at an output side of an integrated waveguide to match (or at least to come close) the (transversal) mode of the optical fibre.

Further, the beat signal generating device may comprise an amplifying device for amplifying the radiation generated by the first and/or the second laser. Such an amplifying device may comprise a laser active region into which a current can be injected (via an electrode), the laser active section being coupled to the first and/or the second laser. In particular, an amplifying device is arranged between the first output port of the beat signal generating device and the first laser and/or between the second output port and the second laser. Using the amplifying device not only an increase of the output power can be realized but it is also possible that a predetermined output power can be set or the amplitude of the output signal can be modulated (in particular with a high frequency, e.g. in the kHz or Mhz region), for example, for producing a signal that can be supplied to a lock-in device.

The invention also relates to a Terahertz system comprising a beat generating device (especially as described above), wherein the beat generating device comprises
  a first laser for generating radiation of a first wavelength;
  a second laser for generating radiation of a second wavelength different from the first wavelength;
  a first and a second output port;
  a phase modulating unit for modifying both the phase of radiation generated by the first laser and the phase of radiation generated the second laser, the phase modulating unit, for example, being arranged between the first and the second laser, wherein the beat signal generating device is configured in such a way that
  the radiation generated by the first laser is transmitted through the second laser and superposed with the radiation generated by the second laser at the second output port, and
  the radiation generated by the second laser is transmitted through the first laser and superposed with the radiation generated by the first laser at the first output port, such that a first beat signal will be emitted at the first output port and a second beat signal will be emitted at the second output port, wherein the phase between the first and the second beat signal can be adjusted by means of the phase modulating unit, wherein
  the first output port of the beat signal generating device is connected to a first component of the Terahertz system and the second output port of the beat signal generating device is connected to a second component of the Terahertz system.

The Terahertz system may be a continuous wave Terahertz system, wherein the first component could be a Terahertz transmitter and the second component may be a local oscillator of a Terahertz receiver. In particular, the Terahertz transmitter may comprise a photomixer to which a beat signal output via the first output port of the beat signal generating device is supplied, wherein upon receipt of the beat signal the photomixer produces a Terahertz signal that could be radiated via an antenna.

Moreover, the invention relates to the use of a beat signal generating device, especially as described above, the beat signal generating device comprising
  a first laser for generating radiation of a first wavelength;
  a second laser for generating radiation of a second wavelength different from the first wavelength;
  a first and a second output port;
  a phase modulating unit for modifying both the phase of radiation generated by the first laser and the phase of radiation generated the second laser, the phase modulating unit, for example, being arranged between the first and the second laser, wherein the beat signal generating device is configured in such a way that
  the radiation generated by the first laser is transmitted through the second laser and superposed with the radiation generated by the second laser at the second output port, and
  the radiation generated by the second laser is transmitted through the first laser and superposed with the radiation generated by the first laser at the first output port, such that a first beat signal will be emitted at the first output port and a second beat signal will be emitted at the second output port, wherein the phase between the first and the second beat signal can be adjusted by means of the phase modulating unit, wherein
the beat signal generating device is used to control a Terahertz system, wherein the first output port of the beat signal generating device is connected to a first component of the Terahertz system and the second output port of the beat signal generating device is connected to a second component of the Terahertz system.

The first component may be a Terahertz transmitter and the second component may be a local oscillator of a Terahertz receiver as already set forth above.

BRIEF DESCRIPTION OF THE DRAWINGS

Embodiments of the invention will be described in more detail hereinafter with reference to the drawings, wherein.

DETAILED DESCRIPTION OF THE DRAWINGS

Figure 1:
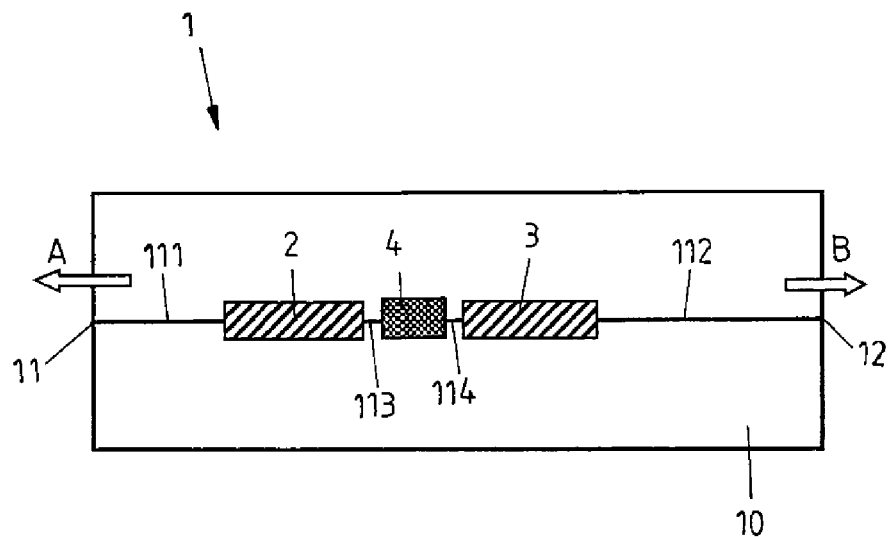
FIG. 1 schematically shows a beat signal generating device according to an embodiment of the invention.

The beat generating device 1 according to the invention shown in FIG. 1 comprises a first monomode laser 2 generating light radiation of a first wavelength and a second monomode laser 3 generating light radiation of a second wavelength different from the first wavelength. Arranged between the two lasers 2, 3 is a phase modulating unit 4 (phase section)

that can be used to shift the phase of light generated by the lasers 2, 3 that passes through the unit 4.

The lasers 2, 3 and the phase modulating unit 4 are integrated on a semiconductor substrate such that the beat signal generating device 1 is formed as an optical chip 10. The beat signal generating device 1 further comprises a first output port 11 and a second output port 12 (formed, for example, by a facet of the chip 10), wherein an output side of the first laser 2 is connected to the first output port 11 via a first integrated waveguide 111. Similarly, the second laser 3 is connected to the second output port 12 via another integrated waveguide 112. Further integrated waveguides 113, 114 are provided between a second output side of the first laser 2 and the phase modulating unit 4 and between a second output side of the second laser 3 and the phase modulating unit 4, respectively. The waveguides 111 to 114 are straight waveguides aligned with one another. For example, the waveguides 111 to 114, the lasers 2, 3 and the phase modulating unit are integrally formed.

Thus, light of the first laser 2 will not only be guided towards the first output port 11 but also in opposite direction through the phase modulating unit 4 and through the second laser 3 towards the second output port 12. In order to allow light (having the first wavelength) from the first laser 2 to pass towards the second output port 12, the second laser 3 is sufficiently transparent for the first wavelength. Similarly, light of the second laser 3 will not only be guided towards the second output port 12 but also through the phase modulating unit 4 and the first laser 2 towards the first output port 11.

Therefore, at the first output port 11 light of the first laser 2 will be superposed with light of the second laser 3 (having travelled through the phase modulating unit 4 and the first laser 2) and at the second output port 12 another light portion generated by the first laser travelling through the phase modulating unit 4 and the second laser 3 will be superposed with light of the second laser 3. The superposition of the first and second wavelength light produces a first beat signal A at the first output port 11 and a second beat signal B at the second output port 12. The phase difference between the beat signals A, B at the first and the second output port 11, 12 can be adjusted by means of the phase modulating unit 4.

It is noted that only one phase modulating unit 4 is used for modifying the radiation of the two lasers 2, 3. However, as the light of the two lasers 2, 3 passes through the phase modulating unit 4 in opposite directions, the phase modulation adds to laser 2 in beat signal B and to laser 3 in beat signal A. The phase shift generated by the phase shifting unit 4 on the light waves produced by the first laser 2 and the second laser 3, respectively, thus will add up such that the relative phase of the beat signals A, B can be changed.

The beat signals A, B emitted at the output port 11 and 12, respectively, can be fed into a photo mixer of a Terahertz transmitter and a photo mixer of a Terahertz receiver (not shown), respectively.

Figure 2:
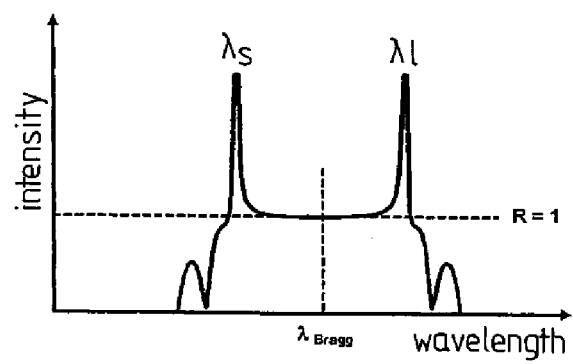
FIG. 2 shows the spectral characteristics of a DFB grating.

Suited lasers for the first and/or the second monomode lasers 2, 3 of the beat signal generating device may be DFB lasers, wherein a possible spectral behaviour of such a DFB laser is exemplarily shown in FIG. 2. Around the Bragg wavelength $\lambda_{Bragg}$ of the DFB laser's Bragg grating the laser comprises a stop band due to the high reflectivity of the Bragg grating in this wavelength region. The laser preferably emits radiation with a wavelength $\lambda_s$ at the short wavelength side (short wavelength mode) of the stop band or with a wavelength $\lambda_l$ on the long wavelength side (long wavelength mode) of the stop band.

In order to achieve monomode lasing of a DFB laser one of the potential laser modes has to be suppressed. In the example shown in FIG. 3 the first laser 2 is a DFB laser configured in such a way that only the mode at the long wavelength side of the stop band is excited, i.e. the "first wavelength" emitted by this laser is the wavelength of the long wavelength mode. For example, the first DFB laser 2 has a gain coupled Bragg grating. The second laser 3 lases only on the short wavelength side of the stop band, i.e. the "second wavelength" emitted by this laser is the wavelength of the short wavelength mode. For example, the second DFB laser has an index coupled Bragg grating.

Further, the Bragg gratings of the two DFB lasers 2, 3 are configured in such a way that the lasing wavelengths lie outside of the stop band of the other laser such that the light radiated by the first DFB laser 2 will be transmitted through the second DFB laser 3 and light generated by the second DFB laser 3 will be transmitted through the first DFB laser 2.

Figure 3:
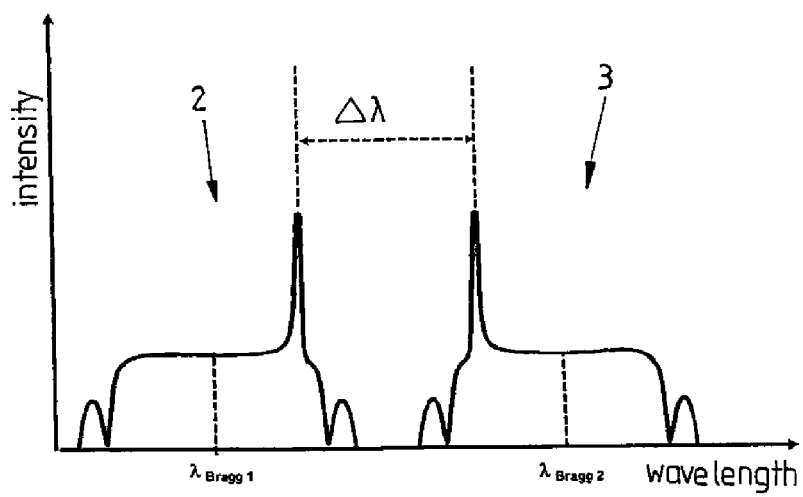
FIG. 3 illustrates the spectral characteristics of two monomode DFB lasers used in a beat signal generating device according to another embodiment of the invention.
Figure 4:
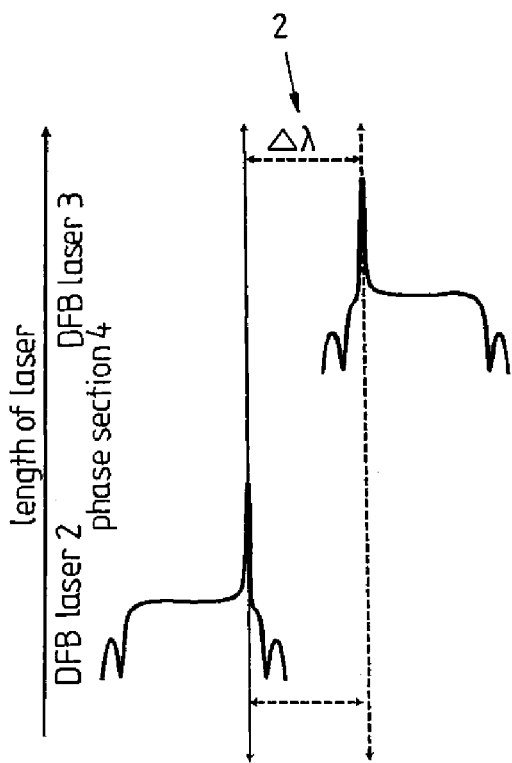
FIG. 4 illustrates the spectral behaviour of the beat signal generating device considered in FIG. 3, wherein a phase section is arranged between the lasers.

FIG. 4 illustrates the two DFB lasers considered in FIG. 3, wherein a phase section 4 is arranged between the two DFB lasers.

Figure 5:
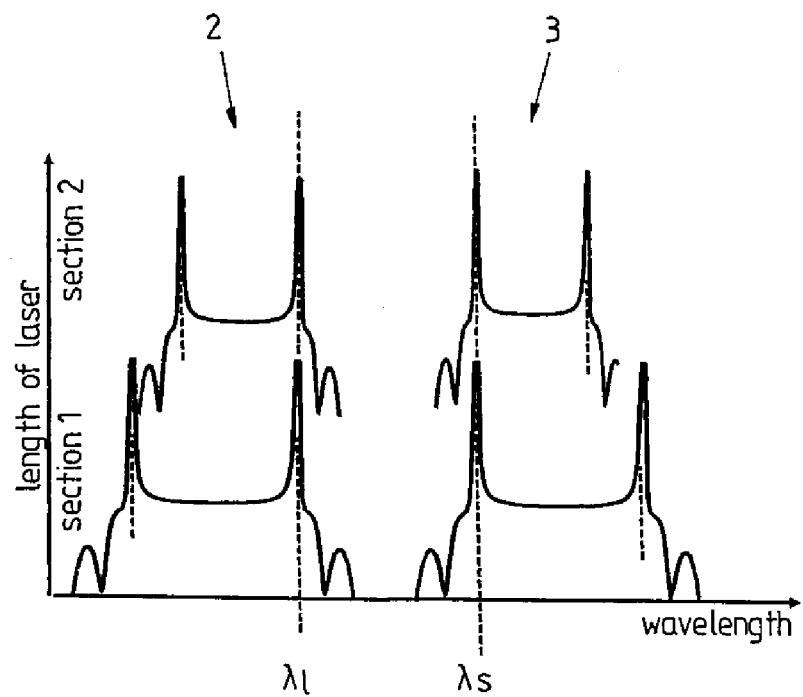
FIG. 5 illustrates the spectral behaviour of a beat generating device according to another embodiment of the invention, the device comprising two two-section DFB lasers.

FIG. 5 relates to another possibility of realising monomode lasers suited for a beat single generating device according to the invention. Both, the first and the second laser 2, 3 are implemented as a two section DFB laser. A two section DFB laser comprises a first DFB section comprising a first (index coupled) Bragg grating and a first laser active region and a second DFB section comprising a second (also index coupled) Bragg grating and a second laser active region.

The first and the second Bragg gratings of the first laser 2 are configured in such a way that they have different stop band widths and different Bragg wavelengths such that only the long wavelength modes in the first and the second DFB section overlap, i.e. the wavelength of the mode on the long wavelength side of the stop band in the first DFB section of laser 2 compares with the wavelength of the long wavelength mode in the second DFB section of laser 2 (wavelength $\lambda_l$). Especially, the Bragg grating of the second section (labelled "section 2" in FIG. 5) comprises a smaller coupling coefficient than the first section (labelled "section 1" in FIG. 5) and a longer Bragg wavelength. Thus, by choosing the properties of the Bragg gratings of the first and the second section monomode output can be created without having to use a gain coupled Bragg grating.

Similarly, the Bragg gratings of the second laser 3 are configured in such a way that only the short wavelength modes of the two sections overlap (wavelength $\lambda_s$). Thus, by using two two-section DFB lasers a first monomode laser and a second monomode DFB laser can be provided, wherein the first laser 2 is sufficiently transparent for letting pass the radiation of the second DFB laser 3 and vice versa.

Figure 6:
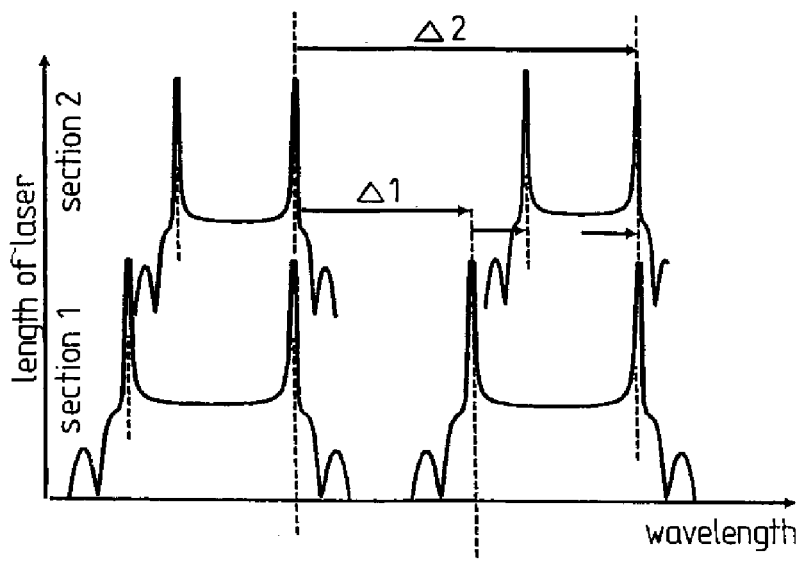
FIG. 6 illustrates the spectrum of FIG. 5 wherein the stop band of one of the lasers was shifted.

At least one of the two two-section DFB lasers 2, 3 of FIG. 5 could be equipped with means for tuning the output wavelength. For example, one of the two lasers 2, 3 comprises heating means, wherein for example a first heating element is assigned to the first Bragg grating section and a second heating element is assigned to the second Bragg grating section of the laser, wherein the heating elements can be controlled independently from one another such that the Bragg wavelength of at least one of the Bragg gratings can be shifted relative to the Bragg wavelength of the other Bragg grating as shown in FIG. 6. Here, the Bragg wavelength of the Bragg grating of the second section of the second laser 3 is shifted towards a longer wavelength such that the overlap of the short wavelength modes at wavelength $\lambda_s$ is shifted towards an overlap of the long wavelength modes. Thus, the wavelength difference between the first and the second wavelength generated by the first and the second lasers 2, 3 is changed from a value Δ1 to a larger value Δ2. Thus, the beat frequency is also changed such that when the beat signals are supplied to a Terahertz system the tuning range of the Terahertz system can be switched.

Figure 7:
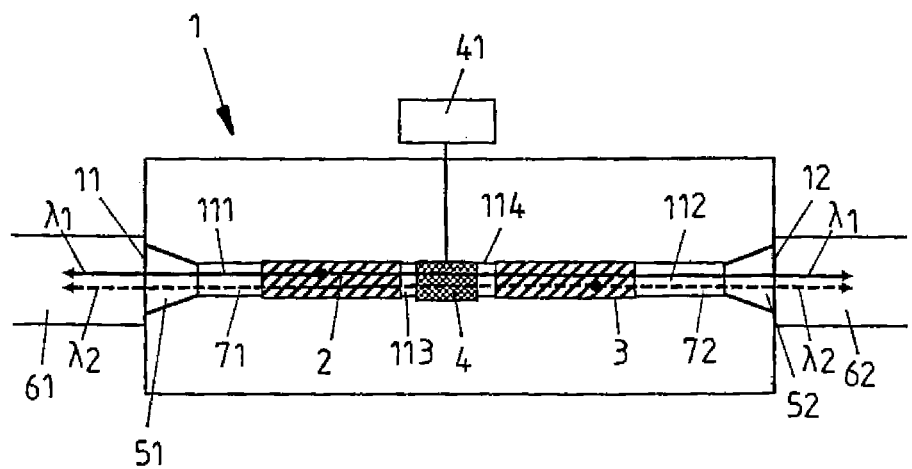
FIG. 7 illustrates a beat generating device according to yet another embodiment of the invention.

FIG. 7 relates to another embodiment of the invention. The configuration compares to the configuration shown in FIG. 1, i.e. the beat generating device 1 comprises a first and a second laser 2, 3 and a phase modulating unit 4 arranged between the lasers.

The phase modulating unit 4 comprises a waveguide to which an electrode is connected, wherein a voltage can be applied to the electrode using a voltage source 41 in order to change the refractive index of the waveguide. Similar to FIG. 1, waveguides 111-114 are provided, wherein the waveguides 111-114, the lasers 2, 3 and the phase modulating unit are integrated in a semiconductor chip. At both output ports 11, 12 light generated by the first laser 2 (having the first wavelength $\lambda_1$) and light of the second laser 3 (having the second wavelength $\lambda_2$) will superpose.

In particular, the waveguides 111 to 114, the lasers 2, 3 and the phase modulating unit are formed by a single integrated waveguide that is structured in such a way that it forms the first and the second laser 2, 3 and the phase modulating unit 4. For example, the lasers 2, 3 comprise an active region and a Bragg grating that form part of the waveguide.

The beat generating device 1 further comprises two mode transforming devices in the form of a first and a second taper 51, 52 which are arranged between an ending of the waveguide 111 and the first output port 11 and an ending of the waveguide 112 and a second output port 12, respectively. The tapers 51, 52 are used to widen the optical mode guided in the waveguides 111, 112 in order to obtain a better overlap with the modes guided in an optical fiber 61, 62 coupled to the first and the second output port 11, 12, respectively.

Further, the beat generating device 1 comprises an amplifying device 71, 72 for amplifying light generated by the first and/or the second laser 2, 3, the amplifying device 71, 72 forming part of the waveguides 111, 112. The amplifying devices may comprises a first laser active section arranged in waveguide 111 and/or a second laser active section arranged in waveguide 112. It is possible that the laser active sections adjoin the first laser and the second laser (e.g. are integrally formed with the laser active region of the first and/or the second laser), respectively, wherein a common electrode may be provided for controlling both the laser active sections of the amplifying device and the first laser and the second laser, respectively. Of course, also separate electrodes can be used for the amplifying device and the first and the second laser, respectively.

REFERENCE SIGNS 1 beat generating device
2 first laser
3 second laser
4 phase modulating unit
11 first output port
12 second output port
41 voltage source
51, 52 taper
61, 62 optical fibre
71, 72 amplifying device
111-114 waveguide

The invention claimed is:

1. A beat signal generating device for use in a Terahertz system, comprising
   a first monomode laser for generating radiation of a first wavelength;
   a second monomode laser for generating radiation of a second wavelength different from the first wavelength;
   a first and a second output port;
   a phase modulating unit for modifying both the phase of radiation generated by the first laser and the phase of radiation generated the second laser, wherein the beat signal generating device is configured in such a way that
   the radiation generated by the first laser is transmitted through the second laser and superposed with the radiation generated by the second laser at the second output port, and
   the radiation generated by the second laser is transmitted through the first laser and superposed with the radiation generated by the first laser at the first output port, such that
   a first beat signal will be emitted at the first output port and a second beat signal will be emitted at the second output port, wherein the phase between the first and the second beat signal can be adjusted by means of the phase modulating unit.

2. The device as claimed in claim 1, further comprising a plurality of straight optical waveguides connecting the first laser to the first output port and to the phase modulating unit, respectively, and connecting the second laser to the second output port and to the phase modulating unit, respectively.

3. The device as claimed in claim 1, wherein the phase modulating unit is an electro-optical phase modulating unit arranged between the first and the second laser.

4. The device as claimed in claim 1, wherein the first laser is a first DFB laser and the second laser is a second DFB laser, the Bragg gratings of the first and the second DFB laser being configured in such a way that the wavelength of the radiation generated by the first DFB laser lies outside the stopband of the second DFB laser and the wavelength of the radiation generated by the second DFB laser lies outside the stopband of the first DFB laser.

5. The device as claimed in claim 4, wherein the first DFB laser is configured to generate radiation on the long wavelength side of its stop band and the second DFB laser is configured to generate radiation on the short wavelength side of its stop band.

6. The device as claimed in claim 4, wherein the first DFB laser comprises a gain coupled Bragg grating.

7. The device as claimed in claim 4, wherein the second DFB laser comprises an index coupled Bragg grating.

8. The device as claimed in claim 4, wherein
   the first DFB laser comprises at least a first and a second section having a first and a second Bragg grating, wherein the Bragg wavelengths and the widths of the stop bands of the first and the second Bragg grating differ in such a way that only the wavelengths of the long wavelength modes in the first and the second section compare, and/or
   the second DFB laser comprises at least a first and a second section having a first and a second Bragg grating, wherein the Bragg wavelengths and the widths of the stop bands of the first and the second Bragg grating differ in such a way that only the wavelengths of the short wavelength modes in the first and the second section compare.

9. The device as claimed in claim 1, wherein at least one of the group consisting of the first and the second laser comprises means for tuning the wavelength of the generated radiation.

10. The device as claimed in claim 8, wherein at least one of the group consisting of the first and the second laser comprises means for tuning the wavelength of the generated radiation, the means for tuning the wavelength being configured in such a way that the Bragg wavelength of at least one of the first and the second Bragg grating of the first DFB laser can be altered such that the overlap of the long wavelength modes can be switched to an overlap of the short wavelength modes, and/or the Bragg wavelength of at least one of the first and the second Bragg grating of the second laser can be altered such that the overlap of the short wavelength modes can be switched to an overlap of the long wavelength modes.

11. The device as claimed in claim 10, wherein the means for tuning the wavelength comprise a first heating element assigned to the first section of the first DFB laser and a second heating element assigned to the second section of the first DFB laser such that the Bragg wavelength of the first and the second Bragg grating of the first DFB laser can be altered independently from one another; and/or a first heating element assigned to the first section of the second DFB laser and a second heating element assigned to the second section of the second DFB laser such that the Bragg wavelength of the first and the second Bragg grating of the second DFB laser can be altered independently from one another.

12. The device as claimed in claim 1, further comprising a mode transforming device for transforming the spatial intensity distribution of the radiation generated by the first and/or the second laser into a modified spatial intensity distribution.

13. The device as claimed in claim 1, further comprising an amplifying device for amplifying the radiation generated by the first and/or the second laser.

14. A terahertz system comprising a beat signal generating device, the beat signal generating device comprising a first laser for generating radiation of a first wavelength;

a second laser for generating radiation of a second wavelength different from the first wavelength;

a first and a second output port;

a phase modulating unit for modifying both the phase of radiation generated by the first laser and the phase of radiation generated the second laser, wherein the beat signal generating device is configured in such a way that the radiation generated by the first laser is transmitted through the second laser and superposed with the radiation generated by the second laser at the second output port, and the radiation generated by the second laser is transmitted through the first laser and superposed with the radiation generated by the first laser at the first output port, such that a first beat signal will be emitted at the first output port and a second beat signal will be emitted at the second output port, wherein the phase between the first and the second beat signal can be adjusted by means of the phase modulating unit, wherein the first output port of the beat signal generating device is connected to a first component of the Terahertz system and the second output port of the beat signal generating device is connected to a second component of the Terahertz system.

15. Use of a beat signal generating device, wherein the beat signal generating device comprises a first laser for generating radiation of a first wavelength;

a second laser for generating radiation of a second wavelength different from the first wavelength;

a first and a second output port;

a phase modulating unit for modifying both the phase of radiation generated by the first laser and the phase of radiation generated the second laser, wherein the beat signal generating device is configured in such a way that the radiation generated by the first laser is transmitted through the second laser and superposed with the radiation generated by the second laser at the second output port, and the radiation generated by the second laser is transmitted through the first laser and superposed with the radiation generated by the first laser at the first output port, such that a first beat signal will be emitted at the first output port and a second beat signal will be emitted at the second output port, wherein the phase between the first and the second beat signal can be adjusted by means of the phase modulating unit, wherein the beat signal generating device is used to control a Terahertz system, wherein the first output port of the beat signal generating device is connected to a first component of the Terahertz system and the second output port of the beat signal generating device is connected to a second component of the Terahertz system.

16. The Terahertz system as claimed in claim 14, wherein the first component is a Terahertz transmitter and the second component is a Terahertz receiver.

* * * * *